(12) United States Patent
Glass et al.

(10) Patent No.: US 10,373,977 B2
(45) Date of Patent: Aug. 6, 2019

(54) TRANSISTOR FIN FORMATION VIA CLADDING ON SACRIFICIAL CORE

(71) Applicant: INTEL CORPORATION, Santa Clara, CA (US)

(72) Inventors: Glenn A. Glass, Portland, OR (US); Anand S. Murthy, Portland, OR (US); Daniel B. Aubertine, North Plains, OR (US); Tahir Ghani, Portland, OR (US); Jack T. Kavalieros, Portland, OR (US); Benjamin Chu-Kung, Portland, OR (US); Chandra S. Mohapatra, Beaverton, OR (US); Karthik Jambunathan, Hillsboro, OR (US); Gilbert Dewey, Hillsboro, OR (US); Willy Rachmady, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/576,393

(22) PCT Filed: Jun. 26, 2015

(86) PCT No.: PCT/US2015/037921
§ 371 (c)(1),
(2) Date: Nov. 22, 2017

(87) PCT Pub. No.: WO2016/209253
PCT Pub. Date: Dec. 29, 2016

(65) Prior Publication Data
US 2018/0158841 A1    Jun. 7, 2018

(51) Int. Cl.
*H01L 27/12*    (2006.01)
*H01L 29/78*    (2006.01)
(Continued)

(52) U.S. Cl.
CPC .... *H01L 27/1211* (2013.01); *H01L 21/76224* (2013.01); *H01L 21/845* (2013.01);
(Continued)

(58) Field of Classification Search
None
See application file for complete search history.

(56) References Cited

U.S. PATENT DOCUMENTS 8,017,463 B2    9/2011   Chang
8,872,225 B2    10/2014  Chu-Kung et al.
(Continued)

FOREIGN PATENT DOCUMENTS

EP    2963674 A1    1/2016
WO    2016209253 A1   12/2016

OTHER PUBLICATIONS

International Search Report and Written Opinion received for PCT/US2015/037921, dated Mar. 25, 2016, 15 pages.
(Continued)

*Primary Examiner* — Dung A. Le
(74) *Attorney, Agent, or Firm* — Finch & Maloney PLLC

(57) ABSTRACT

Techniques are disclosed for customization of fin-based transistor devices to provide a diverse range of channel configurations and/or material systems, and within the same integrated circuit die. In accordance with an embodiment, sacrificial fins are cladded and then removed thereby leaving the cladding layer as a pair of standalone fins. Once the sacrificial fin areas are filled back in with a suitable insulator, the resulting structure is fin-on-insulator. The new fins can be configured with any materials by using such a cladding-on-core approach. The resulting fin-on-insulator structure is favorable, for instance, for good gate control while eliminating or otherwise reducing sub-channel source-to-drain (or drain-to-source) leakage current. In addition, parasitic
(Continued)

capacitance from channel-to-substrate is significantly reduced. The sacrificial fins can be thought of as cores and can be implemented, for example, with material native to the substrate or a replacement material that enables low-defect exotic cladding materials combinations.

20 Claims, 6 Drawing Sheets

(51) Int. Cl.
  H01L 21/84    (2006.01)
  H01L 29/66    (2006.01)
  H01L 21/762   (2006.01)
  H01L 29/06    (2006.01)
  H01L 29/161   (2006.01)
  H01L 29/20    (2006.01)

(52) U.S. Cl.
  CPC ........ *H01L 29/0649* (2013.01); *H01L 29/161* (2013.01); *H01L 29/20* (2013.01); *H01L 29/66545* (2013.01); *H01L 29/66795* (2013.01); *H01L 29/78* (2013.01); *H01L 29/0673* (2013.01)

(56) References Cited

U.S. PATENT DOCUMENTS

| | | | |
|---|---|---|---|
| 8,937,299 B2 | 1/2015 | Basu et al. | |
| 8,969,974 B2* | 3/2015 | Liaw | H01L 21/823821 |
| | | | 257/401 |
| 2009/0026530 A1* | 1/2009 | Wilson | H01L 29/66795 |
| | | | 257/328 |
| 2009/0146243 A1* | 6/2009 | Lee | H01L 29/66621 |
| | | | 257/506 |
| 2013/0037869 A1 | 2/2013 | Okano | |
| 2014/0151814 A1 | 6/2014 | Giles et al. | |
| 2015/0008484 A1 | 1/2015 | Cea et al. | |
| 2015/0061014 A1 | 3/2015 | Jacob et al. | |
| 2015/0132920 A1 | 5/2015 | Vellianitis et al. | |
| 2015/0243745 A1* | 8/2015 | Kelly | H01L 29/785 |
| | | | 257/369 |

OTHER PUBLICATIONS

International Preliminary Report on Patentability received for PCT/US2015/037921, dated Jan. 4, 2018, 12 pages.
Extended European Search Report received for EP Application No. 15896540.0, dated Feb. 27, 2019. 7 pages.

* cited by examiner

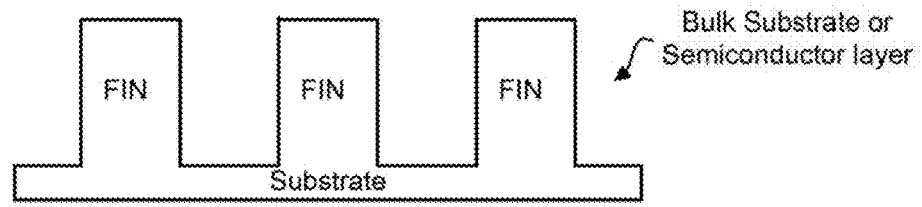
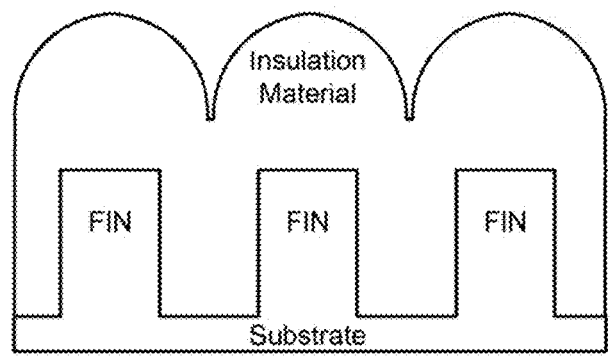
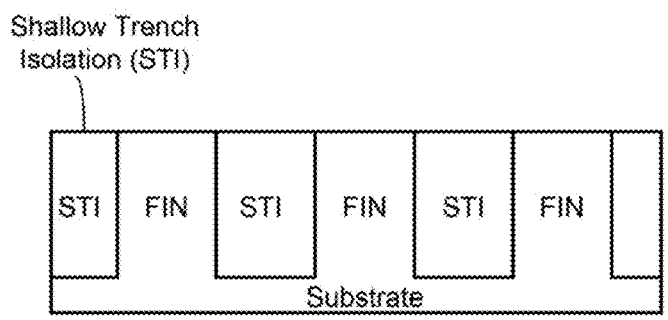 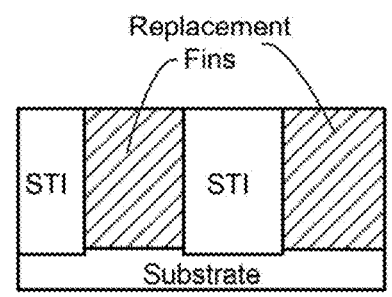
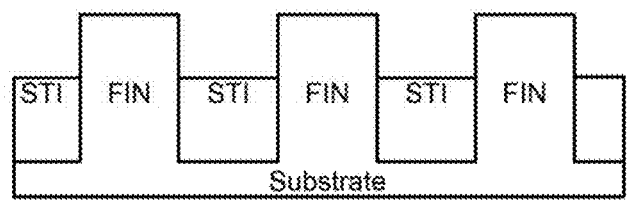 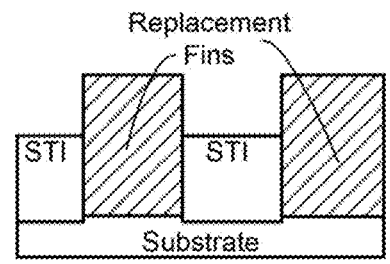

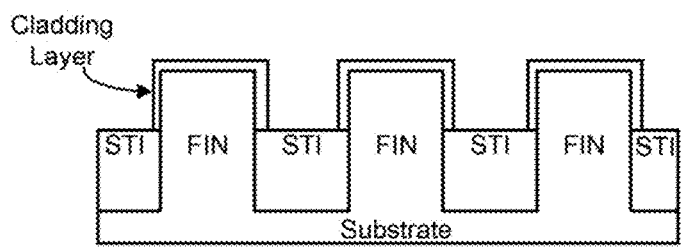
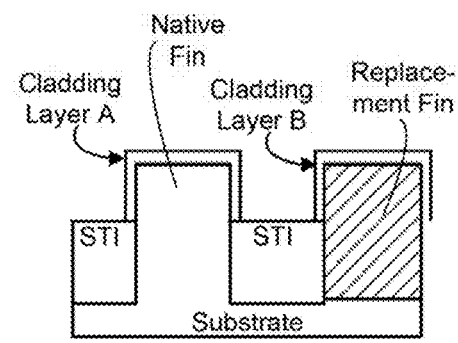
Fig. 5            Fig. 5'
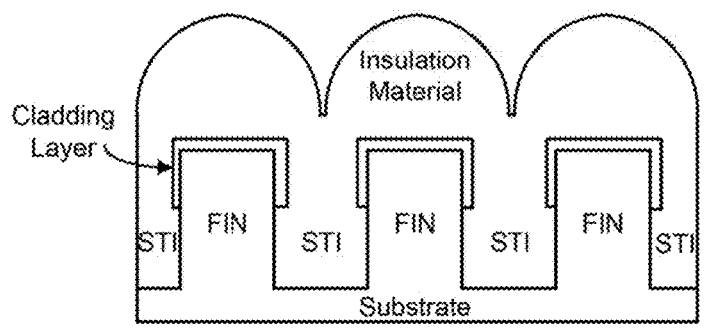
Fig. 6
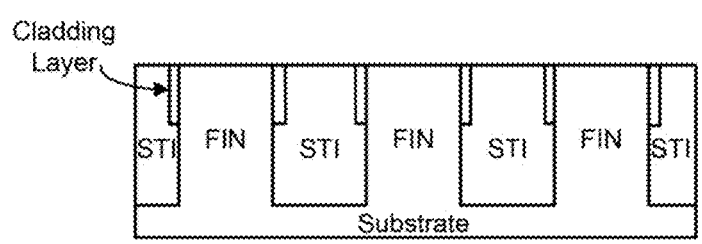
Fig. 7

US 10,373,977 B2

TRANSISTOR FIN FORMATION VIA CLADDING ON SACRIFICIAL CORE

BACKGROUND

A FinFET is a transistor built around a thin strip of semiconductor material (generally referred to as the fin). The transistor includes the standard field effect transistor (FET) nodes, including a gate, a gate dielectric, a source region, and a drain region. The conductive channel of the device resides on the outer sides of the fin beneath the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate FinFET. Other types of FinFET configurations are also available, such as so-called double-gate FinFETs, in which the conductive channel principally resides only along the two sidewalls of the fin (and not along the top of the fin). There are a number of non-trivial performance issues associated with fin-based transistors.

BRIEF DESCRIPTION OF THE DRAWINGS

FIGS. 1 through 11 illustrate cross-section side views of various intermediate integrated circuit structures resulting from a method of forming fin-based transistors, in accordance with an embodiment of the present disclosure.

Figure 8:
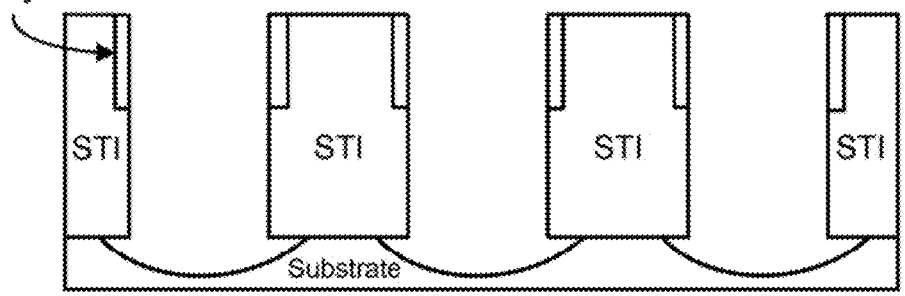
Figure 9:
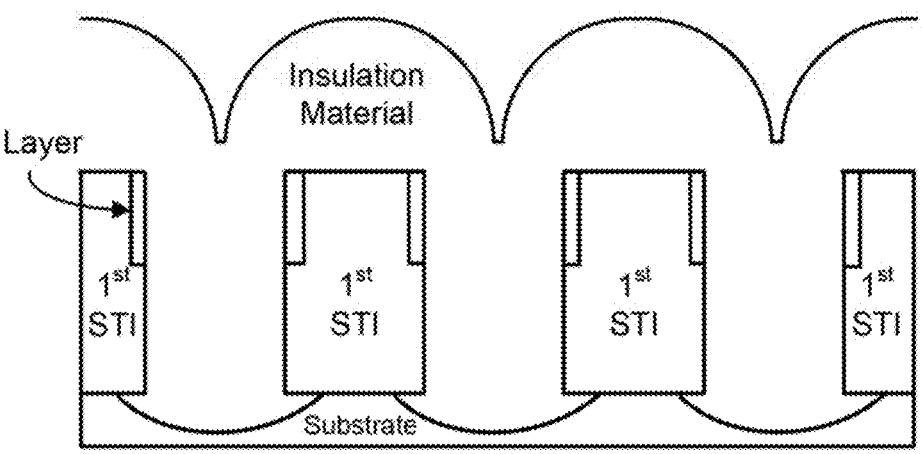

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for customization of fin-based transistor devices to provide a diverse range of channel configurations and/or material systems, and within the same integrated circuit die. In accordance with an embodiment, sacrificial fins are cladded and the sacrificial fins are then removed thereby leaving the cladding layer as a pair of standalone fins. Once the voids resulting from removal of the sacrificial fin areas are filled back in with a suitable insulator material, the resulting structure is fin-on-insulator. The new fins can effectively be configured with any materials by using such a cladding-on-core approach, such as a single crystal composition or multiple layers of different materials. Such a fin-on-insulator structure is favorable, for instance, for good gate control while eliminating or otherwise reducing sub-channel source-to-drain (or drain-to-source) leakage current. In addition, parasitic capacitance from channel-to-substrate is significantly reduced. The sacrificial fins or cores can be implemented, for example, as native silicon or a replacement core that encourages defect-free exotic materials combinations.

General Overview

As previously indicated, there are a number of non-trivial performance issues associated with fin-based transistors. For instance, current state of the art FinFET or so-called tri-gate devices have a sub-channel region continuous with the fin. This permits a conduction path for parasitic off-state source-to-drain (and drain-to-source) current leakage for the FinFET as well as channel-to-substrate parasitic capacitance. Thus, and in accordance with an embodiment of the present disclosure, techniques are provided to eliminate or otherwise substantially reduce (e.g., by greater than 80% in some embodiments) both sub-channel source-to-drain (and drain-to-source) current leakage and parasitic capacitance from channel-to-substrate.

In particular, a fin-on-insulator structure is provided, in accordance with an embodiment. With respect to manufacturing, sacrificial fins are cladded and then each sacrificial fin is removed thereby leaving the cladding layer as a pair of standalone fins. An insulation material is grown or otherwise deposited into the trenches left by removal of the sacrificial fins, and planarized. As will be appreciated in light of this disclosure, the cladding-on-core approach allows the new fins to be configured with any desired semiconductor materials, such as a single crystal composition or multiple layers of different materials. In addition, different cladding layers can be used to provide different fin types on the same substrate, such as a silicon germanium (SiGe) cladding for p-type fins and a silicon or III-V compound cladding for n-type fins. In any case, each of the new fins is well-isolated from the substrate via an insulator layer in which the new fin is sitting, such that current leakage in the sub-channel is contained, and parasitic capacitance from channel-to-substrate is significantly reduced.

The sacrificial fins or so-called cores can be, for example, native silicon or other desired native material, or a replacement material that enables defect-free or otherwise relatively low-defect exotic materials combinations. Some example embodiments include relaxed buffer materials that can also serve as disposable cores, such as silicon cores for SiGe fins, SiGe cores for germanium fins, and gallium arsenide (GaAs) cores for indium gallium arsenide (InGaAs) fins, to provide a few examples. The range of paired materials extends to any viable combination of mutually compatible materials. The core (sacrificial fin) may be deposited in trench for, for example, column IV materials (e.g., silicon/SiGe) and column III-V materials (e.g., GaAs/InGaAs). In such cases, the crystal quality of the sacrificial core is maintained at a high level owing to trapping of dislocations by the geometry of the trench. Thus, the cladding layers (and by extension, the new fins which are formed from the cladding layers) can be made essentially defect-free or with relatively low defect densities of less than 10000 per cm of line length, according to some embodiments.

Once the new fins are formed, a FinFET transistor process flow can be executed to fabricate, for instance, high-k metal gate transistors. Any number of transistor types and/or formation process flows may benefit from the fin structures and forming techniques provided herein, such as n-channel metal oxide semiconductor (NMOS) transistors, p-channel MOS (PMOS) transistors, or both PMOS and NMOS transistors within the same flow, whether configured with thin or thick gates, and with any number of geometries. As will be appreciated, compressively strained SiGe is particularly attractive for PMOS devices, whether alone or in conjunction with NMOS devices such as silicon or III-V NMOS devices. For instance, the techniques provided herein can be used in fabricating SiGe PMOS fins and silicon or III-V NMOS fins together. Likewise, numerous material systems can benefit from the techniques described herein, as will be apparent in light of this disclosure, and this disclosure is not intended to be limited to any particular one or set. Rather, the techniques can be employed wherever channel diversity with respect to, for instance, materials, polarity, and/or strain is helpful.

The techniques provided herein can be embodied, for example, in any number of integrated circuits, such memories and processors and other such devices that are fabricated with transistors and other active junction semiconductor devices, as well as in methodologies suitable for practice at fabs where integrated circuits are made. Use of the techniques described herein manifest in a structural way. For instance, a cross-section image of transistors formed in accordance with an embodiment, such as an image provided with a transmission electron microscope (TEM), demonstrate a fin-on-insulator structure, as compared to a conventional fin-based transistors having a sub-channel region continuous with the fin.

Methodology and Architecture

FIGS. 1 through 11 illustrate a method for forming a fin-based transistor structure in accordance with an embodiment of the present disclosure. As will be appreciated, each of the views shown in FIGS. 1 through 11 is a cross-sectional side view taken across the channel region and perpendicular to the fins (both sacrificial fins and replacement fins). As can be seen in FIG. 1, a substrate is provided. Any number of suitable substrates can be used here, including bulk substrates, semiconductor-on-insulator substrates (XOI, where X is a semiconductor material such as silicon, germanium, SiGe, or III-V material), and multi-layered structures. In one specific example case, the substrate is a bulk silicon substrate. In another example case, the substrate is a silicon-on-insulator (SOI) substrate. In another example case, the substrate is a bulk SiGe substrate. In another example case, the substrate is a multilayered substrate having a SiGe layer on a silicon layer. In another example case, the substrate is a SiGe-on-insulator substrate. Any number of configurations can be used, as will be apparent.

As can be further seen in FIG. 1, shallow trenches are etched into the substrate to form a plurality of fins. These fins are sacrificial in nature and will effectively provide a core upon which a cladding layer is later provided. As will be discussed in turn, it is this cladding that will be used to form transistor fins. The shallow trench etch can be accomplished with standard photolithography including hardmask patterning and wet and/or dry etching, or with patterning by backbone and spacer layer as is sometimes done. The geometry of the trenches (width, depth, shape, etc) can vary from one embodiment to the next as will be appreciated, and the present disclosure is not intended to be limited to any particular trench geometry. In one specific example embodiment having a silicon substrate and a two-layer hardmask implemented with a bottom local oxide layer and a top silicon nitride layer, a dry etch is used to form the trenches that are about 100 Å to 5000Å (10 nm to 500 nm) below the top surface of the substrate. The trench depth can be set depending on factors such as the desired sacrificial fin height as well as how much as the sacrificial fin will be cladded, and the desired thickness of the STI material to be deposited. After the fins are formed, a planarization process can be executed to prepare the structure for subsequent processing and to remove any hardmask material. In other embodiments, however, note that some of the hardmask may be left behind, so that only sides of the fin are cladded (and not the top), as will be discussed in turn with reference to FIG. 5.

While the illustrated embodiment shows fins as having a width that does not vary with distance from the substrate, the fin may be narrower at the top than the bottom in other embodiments, wider at the top than the bottom in still other embodiments, or having any other width variations and degrees of uniformity (or non-uniformity) in still other embodiments. Further note that the width variation may, in some embodiments, be symmetrical or asymmetrical. Also, while the sacrificial fins are illustrated as all having the same width, some fins may be wider and/or otherwise shaped differently than others. For instance, as the cladding on the sacrificial fins is what will actually be used for the active fins, the width of the sacrificial fin can be used to set the spacing between those active fins. So, for example, some of the sacrificial fins may be narrower to provide active fin-pairs that are closer together, while others of the sacrificial fins may be wider to provide active fin-pairs that are more spaced apart. Other arrangements may be implemented, as will be appreciated in light of this disclosure.

As can be seen in FIG. 2, the trenches are subsequently filled with an insulator material (e.g., an oxide, nitride, polymer, or other suitable insulator) to form shallow trench isolation (STI) structures, using any number of standard deposition processes. In one specific example embodiment having a silicon substrate, the deposited insulator material is silicon dioxide ($SiO_2$). In still other embodiments, a low-k dielectric can be used, such as in embodiments where the insulation layer that will ultimately result between the active fins and the substrate is relatively thin (after the STI is recessed, as shown in FIG. 4). Examples of low-k dielectric materials include, for instance, porous oxides such as $SiO_2$, doped oxides as carbon-doped $SiO_2$ or fluorine-doped $SiO_2$ or any such doped materials configured with a degree of porosity, polyimides and polymers such as spin-on silicon based polymeric dielectrics and spin-on organic polymeric dielectrics, fluorine-doped amorphous carbon, spin-on Teflon/PTFE. In some embodiments, an annealing process may be carried out on the dielectric layer to improve its quality when a low-k material is used. The deposited insulator material for filling the trenches can be selected, for example, based on compatibility with the cladding material to be added later in the process. Note the excess insulation material may have a profile as shown when using a blanket deposition process, due to the underlying topography.

FIG. 3 demonstrates the structure after the insulation material is planarized down to the top of the sacrificial fins using, for example, chemical mechanical planarization (CMP) or other suitable process capable of planarizing the structure, according to an embodiment. In cases where hardmask material is left on top of the sacrificial fins, the hardmask can be used as an etch stop. In one such example case employing a bi-layer hardmask, the top layer of the hardmask is removed by the CMP process and at least a portion of the bottom layer of the hardmask (e.g., pad oxide) can be used as the etch stop. The hardmask can be used, for example, to protect the fins during subsequent processing, such as during the STI recess process shown in FIG. 4. In addition, in some embodiments, the remaining hardmask can further be used to prevent cladding material from growing on the top of the sacrificial fins, such as the cladding process shown in FIG. 5. In any case, an array of sacrificial fins or cores with STI isolation material deposited therebetween is provided, in accordance with an embodiment.

Note that if a core material different from the substrate material is desired, then the methodology at this point may further include a fin recess and replace process. For example, while silicon sacrificial fins will accommodate, for example, growth of SiGe cladding thereon for PMOS and NMOS active channels, higher performance options include, for example, germanium active channel for PMOS or NMOS, or a III-V material for NMOS. In such cases there are materials that cannot be deposited in a strained state directly on silicon. Therefore a fin recess and replace process can be employed to take advantage of deposition in a narrow trench to contain the dislocations near the bottom of the trench. In one such example embodiment, the native sacrificial fins are removed with a suitable dry and/or wet etch scheme, followed by an epitaxial deposition of replacement sacrificial fin material having an arbitrary composition suitable for cladding cores as provided herein. One such example recess and replace fin process is described in U.S. Patent Application Publication No. 2014/0027860, although other suitable techniques may be used as well. In a specific example scenario, native silicon fins of a bulk silicon wafer or silicon layer (e.g., SOI) are recessed using a selective etch such as nitrogen fluoride ($NF_3$) plasma dry etch or ammonium hydroxide ($NH_4OH$) wet etch. The etch can recess the sacrificial silicon fins down to near the bottom of the STI. The replacement material can be selected, for example, based on compatibility with the desired cladding material, and is grown or otherwise deposited in the trench. FIG. 3' shows an example resulting structure after such replacement fins have been formed and planarized, according to an embodiment. The replacement fins may be all one type, or there may be multiple replacement fin types (e.g., one type for PMOS transistors and another type for NMOS transistors). In still further embodiments, the resulting structure may include a mix of native and one or more types of replacement fins. In any such configuration, the sacrificial fin material can be selected in conjunction with a cladding material to provide fins having various desired qualities such as those with respect to composition, strain, mobility, and polarity.

FIG. 4 demonstrates the resulting structure after the STI is recessed to below the top portion of the native fin structures, according to an embodiment. Likewise, FIG. 4' demonstrates the resulting structure after the STI is recessed to below the top portion of the replacement fin structures, according to another embodiment. Any suitable etch process (e.g., wet and/or dry etch) can be used to recess the STI material. In some cases, the etch chemistry is selective in that it only removes the STI material but none or relatively little of the fin material(s). The depth of the STI recess (or remaining thickness of the STI) can vary from embodiment to embodiment, and in some cases is largely dependent on factors such as desired height of overall cladding-based fin (to be formed later in the process) and the dielectric constant of the STI material. For instance, for a low-k dielectric STI material, the STI recess depth can be relatively deep such that the remaining STI thickness can be relatively thin, compared to the remaining STI thickness with a regular dielectric STI material such as $SiO_2$. In some example embodiments, the STI recess depth is such that 25% to 85% of the overall sacrificial fin height is exposed, although other embodiments may remove more or less of the STI material, depending on what is suitable for the intended application. In general, the thickness of the remaining dielectric STI material should be sufficient to inhibit conduction paths for parasitic off-state current (sub-channel) leakage between source and drain. Further note that the depth of the STI etch will largely define the length of the active fins to be provisioned later in the process. In particular, the height of each active fin-pair (to be formed from cladding deposited on the sides of the sacrificial fins) will correspond to the height of the portion of the sacrificial fins that extends above the recessed STI. In addition, the distance of the bottoms of those active fins from the substrate will correspond to the remaining thickness of the STI material after the STI recess. Thus, these parameters such as active fin height and STI thickness can be tuned as desired for a given application and set of materials.

FIG. 5 demonstrates the resulting structure after a cladding layer has been formed on the exposed sacrificial native fins, according to an embodiment. As can be seen, the cladding layer is selectively deposited in that it is only formed mostly on the exposed fins and not or otherwise minimally on the STI material. As the cladding will ultimately form the active fins, the cladding material can be selected for its ability to provide a desired polarity and strain. To this end, the sacrificial fin material can be selected so as to accommodate the goals for the active fin material. In some embodiments, the cladding layer can be an epitaxial growth of a semiconductor material of arbitrary composition, suitable for a given application. So, for example, an example embodiment having sacrificial silicon fins with SiGe cladding is an appropriate arrangement for PMOS or NMOS active channels. Likewise, sacrificial SiGe fins with germanium cladding is another appropriate arrangement for PMOS or NMOS active channels. In another example embodiment, the cladding layer can be an epitaxial growth of indium gallium arsenide (InGaAs) on sacrificial fins of gallium arsenide (GaAs), for NMOS active channels. In still another embodiment, the cladding layer can be an epitaxial growth of InGaAs on sacrificial fins of indium phosphide (InP), for NMOS active channels. In still another embodiment, the cladding layer can be an epitaxial growth of indium antimonide (InSb) on sacrificial fins of gallium antimonide (GaSb), for NMOS active channels. Any suitable epitaxial deposition techniques can be used, such as chemical vapor deposition (CVD), rapid thermal CVD (RT-CVD), and gas-source molecular beam epitaxy (GS-MBE), to provide the cladding material layer on the sacrificial fins (native or replacement). Table 1 summarizes some such specific sacrificial core and cladding arrangements for providing channel types.

TABLE 1

Example core, cladding and channel types

| Sacrificial Core | Cladding | Channel Type |
| --- | --- | --- |
| Silicon | SiGe (30% to 70% Ge) | PMOS or NMOS |
| SiGe (>60% Ge) | Germanium | PMOS or NMOS |
| GaAs | InGaAs (30% to 70% In) | NMOS |
| InP | InGaAs (30% to 70% In) | NMOS |
| GaSb | InSb | NMOS |

As will be further appreciated, the cladding layer thickness can vary from one embodiment to the next, depending on the desired thickness of the active fins (and gate region). In some embodiments, the cladding layer has a thickness in the range of about in the range of 5 nm to 100 nm, or 10 nm to 50 nm, or about 10 nm to 25 nm. In addition, the height of the sacrificial fin portion that is extending above the STI will effectively define the height of the active fins. To this end, the cladding layer extending along the sides of the sacrificial fins (in the vertical direction in the figures) has a length in the range of about in the range of 10 nm to 100 nm, or 20 nm to 70 nm, or 20 nm to 60 nm, or about 10 nm to 25 nm. In some such cases, about 5 nm to 10 nm of the sacrificial fins (whether native or replacement) remains buried in the STI. In some embodiments, there may be a thin passivation treatment performed on the array of cladding layers prior to the second STI fill, so as to reduce or eliminate fixed and mobile charges at the semiconductor to STI interface. Such charges can act as leakage paths from source-to-drain as well as induce parasitic capacitance. This treatment will only be effective for the exposed surface side of the cladding layer and optionally may be repeated for the other side later in the flow, according to an embodiment. The passivation treatment can be carried out in a number of ways. In one embodiment having silicon sacrificial fins, the passivation treatment layer can be formed by, for example, growth of a thin layer of native oxide ($SiO_2$, via timed oxidation). For SiGe or germanium fins, the passivation treatment layer can be formed by, for example, growth of a thin layer of aluminum oxide, yttrium metal, or silicon. For III-V fins, the passivation treatment layer can be formed by, for example, growth of a thin layer of elemental sulfur or various high-k dielectrics such as aluminum oxide and hafnium oxide, to name some examples. The thickness of the passivation treatment layer can vary, but in some embodiments is in the 1 to 10 nm range.

FIG. 5' demonstrates another example embodiment where multiple types of sacrificial fins are used, each type having different cladding material formed thereon. In the particular example embodiment shown, the resulting structure after a multi-phase cladding process is shown, wherein a first cladding layer (cladding layer A) has been formed on the exposed sacrificial native fins and a second cladding layer (cladding layer B) has been formed on the exposed sacrificial replacement fins. As will be appreciated, the cladding layers A and B can be selectively deposited, so that cladding material A is only provided on the native fins, and cladding material B is only provided on the replacement fins. In some cases where deposition selectively is not possible, a masking scheme can be used to protect one set of sacrificial fins while another target set of sacrificial fins is cladded. Any combination of native and replacement fins can be used, as will be appreciated in light of this disclosure. The material systems previously discussed are equally applicable to embodiments having multiple sacrificial fins and/or cladding types. So, for instance, in the embodiment shown, the native fins may be silicon and cladded with SiGe and the replacement fins may be SiGe and cladded with germanium. In another embodiment, the native fins may be silicon and cladded with SiGe and the replacement fins may be GaAs and cladded with InGaAs. In still another embodiment, the native fins may be GaAs and cladded with InGaAs and the replacement fins may be GaSb and cladded with InSb. Numerous other variations will be apparent in light of this disclosure. While two types of fins and claddings are shown, other embodiments may include a single type of fins with one or more cladding types, while still other embodiments may include three or more fin types and three or more cladding types, and so on.

As can be seen in FIG. 6, the structure is again filled with an insulator material (e.g., an oxide, nitride, polymer, porous $SiO_2$, or other suitable insulator) to fill back in the recessed portions of the STI, using any number of standard deposition processes. The insulator material can be the same as the insulator material deposited to form the STI (FIG. 2), but need not be. For purposes of simplicity, it is assumed to be the same and there is no detectable delineation between the two depositions of STI material. The resulting structure is then planarized, as shown in FIG. 7. The previous discussion with provisioning and planarizing the STI with respect to FIGS. 2 and 3 is equally applicable here. However, note that this time the planarization is tuned to remove the horizontal section of the cladding layer as well, as further shown in FIG. 7. Alternatively, if no cladding layer was deposited on top the sacrificial fins due to a hardmask material being there, for instance, then the planarization can be tuned to remove that hardmask material. In any case, a structure similar to that shown in FIG. 7 results.

Note that the cladding buried between the STI and sacrificial fins is now formed in fin-shaped vertical lines. The cladding associated with each sacrificial fin is sometimes referred to herein as a fin-pair, for ease of reference. Such reference to fin-pairs is not intended to imply any dependency or other limitation between the two fins making up that pair. For instance, the fins may be used in a similar way (e.g., to form a similar PMOS or NMOS transistor devices) or differently (e.g., to form different transistor devices, such as one an NMOS device and the other a PMOS device). Further note that while the fins shown in FIGS. 6 and 7 are native fins, they may also be replacement fins, as will be appreciated and as shown in FIGS. 3'-5'. For the sake of brevity, no further depictions of sacrificial replacement fins are provided, but embodiments having such sacrificial replacement fins will be readily apparent in light of this disclosure, which accommodate various types of cladding material which in turn accommodates various active channel material types as previously explained.

Figure 10:
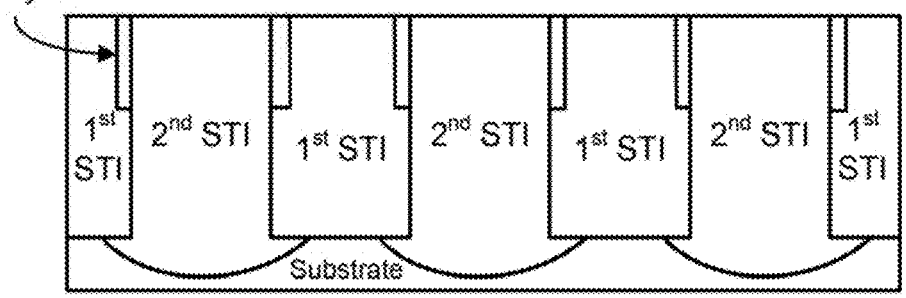
Figure 11:
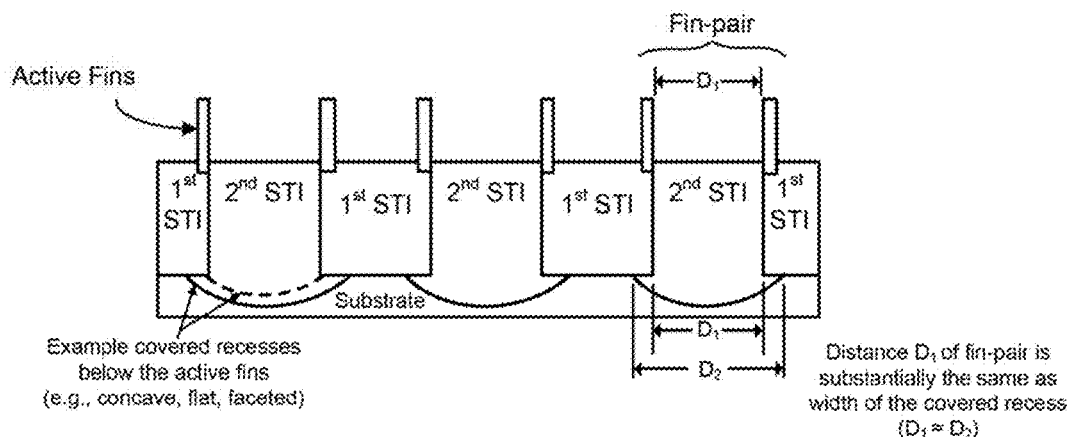
Figure 12:
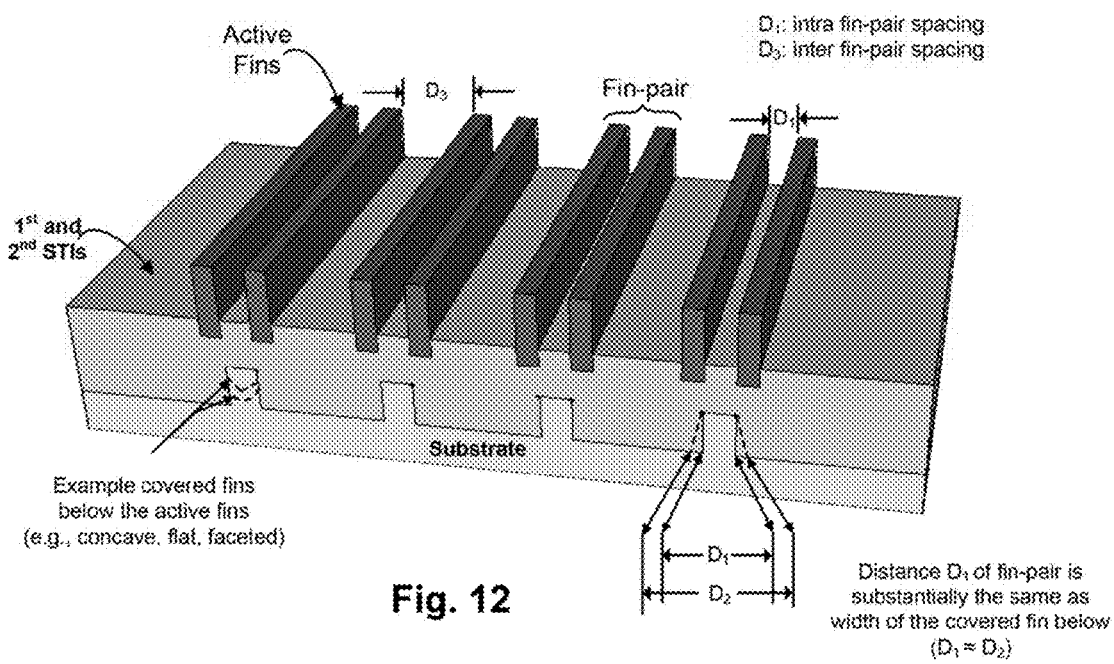
FIG. 12 shows a perspective view of an integrated circuit structure having a fin-based transistor configured in accordance with another embodiment of the present disclosure.

With reference now to FIG. 8, a selective etch is used to remove the sacrificial fins or cores so as to leave behind just the cladding-based fins and neighboring STI. The depth of the etch can vary from one embodiment to the next, but in this example case extends to just above the bottom of the STI so as to leave a short fin or stub-like remnant of the sacrificial fin (see FIG. 12, for example), or just past that bottom of the STI so as to leave a recess-like remnant of the sacrificial fin (see FIGS. 8-11, for example). FIGS. 11 and 12 show additional example etch depths and shapes that may result from the etch, with dashed lines. In some embodiments, there may be a mix of such fin stubs and recesses (e.g., an alternating pattern of short fins and shallow recesses). The height of the fin stubs may be very small (almost flush), as may be the depth of the recesses, but still detectable when present. Note that there may be multiple stub heights and recess depths, and such heights and depths need not be uniform or otherwise the same. In any such cases, note that although a sacrificial fin or core is at least partially removed, there is still a remnant or indicator of that fin's existence. Another indicator of the sacrificial fin's existence is the fin-pair above and offset to each side of the sacrificial fin location (resulting from the cladding-on-core process). This is particularly apparent when the lateral spacing between the two fins making up a fin-pair is different from the lateral spacing between neighboring fin-pairs (meaning that the sacrificial fin width, which sets the spacing between the fins of the fin-pair, is different than the distance between sacrificial fins). Note that the etch chemistry can be selective or otherwise tuned, so as to only remove sacrificial fin material and none or very little of the STI and cladding-fins. Such a selective etch avoids the need for masking the STI and cladding-fins and directionally etching out the sacrificial fins. In other embodiments, however, the sacrificial fin removal process can be carried out using any suitable means to yield structures similar to that shown in FIG. 8, including masking and directional etch schemes. Table 2 shows some example selective etch schemes that can be used to remove the sacrificial cores of various core-cladding material systems. Assume the STI is, for example, $SiO_2$ or any of the low-k dielectric insulators previously mentioned.

TABLE 2

Example core, cladding, and core-etchant materials that are compatible sets

| Sacrificial Core | Cladding | Etchant to Remove Sacrificial Core |
|---|---|---|
| Silicon | SiGe (>30% Ge) | $NH_4OH$ wet or $NF_3$ dry |
| SiGe (>60% Ge) | Germanium | $NH_4OH$ wet or $NF_3$ dry |
| GaAs | InGaAs (30-50% In) | KOH wet |
| InP | InGaAs | KOH wet or $HCL:H_3PO_4$ wet |
| GaSb | InSb | KOH wet or $C_4H_4KNaO_6:H_2O:HCl:H_2O_2$ |

As can be seen from Table 2, selective removal of silicon cores having SiGe cladding can be accomplished with ammonium hydroxide ($NH_4OH$) wet processing while leaving substantially untouched the SiGe having a germanium concentration of greater than 30%. Alternatively, or in addition to, a dry plasma etch of nitrogen fluoride ($NF_3$) can be used to achieve a similar selective etch result. Similar etch chemistries can also be used for or column IV material systems, such as SiGe sacrificial fins having a germanium concentration in excess of 60% having a germanium cladding thereon. In some such cases, the germanium concentration of the SiGe core is in excess of 75%. Another example includes using potassium hydroxide (KOH) to selectively remove GaAs sacrificial fins while not removing InGaAs cladding layers thereon. In this example embodiment, the InGaAs cladding has an indium concentration in the range of 30% to 50%. Another example III-V material embodiment includes using potassium hydroxide (KOH) to selectively remove InP sacrificial fins while not removing InGaAs cladding layers thereon. Another example wet etch that can be used to selectively etch such a core-cladding system is hydrogen chloride phosphoric acid ($HCL: H_3PO_4$). Another example III-V material embodiment includes using potassium hydroxide (KOH) to selectively remove GaSb sacrificial fins while not removing InSb cladding layers thereon. Another example wet etch that can be used to selectively etch such a core-cladding system is potassium sodium tartaric acid with water, hydrogen chloride and hydrogen peroxide ($C_4H_4KNaO_6:H_2O:HCl:H_2O_2$). Numerous other combinations of material systems and selective etchants will be apparent in light of this disclosure, and the present disclosure is not intended to be limited to the various examples provided herein, as will be appreciated. Depending on the etch chemistry employed, in some embodiments, the sacrificial fin (core) recess etching process may slightly alter the thickness of the cladding layer that becomes exposed, such that the exposed portions of the cladding layer may be different (e.g., thinner) after the etch. In some such embodiments, the initial cladding layer thickness accounts for anticipated thinning due to subsequent processing. For selective etch schemes, this consideration is less of a concern. In some embodiments, there may be a thin passivation treatment layer performed on the array of cladding fins after the sacrificial fins are removed, so as to reduce or eliminate fixed and mobile charges at the semiconductor to STI interface. As previously explained, such charges can act as leakage paths from source-to-drain as well as induce parasitic capacitance, and this treatment will only be effective for the exposed surface side of the cladding layer and optionally may have already been done for the other side earlier in the flow, according to some embodiments. The previous discussion with respect to passivation treatment materials and layer thickness are equally applicable here, as will be appreciated.

As can be seen in FIG. 9, the structure is again filled with an insulator material (e.g., an oxide, nitride, polymer, or other suitable insulator) to fill back in the recessed portions of the STI, using any number of standard deposition processes. The resulting structure is then planarized, as shown in FIG. 10. The previous discussion with provisioning and planarizing the STI with respect to FIGS. 2 and 3 is equally applicable here. As depicted in FIG. 10, the newly deposited and planarized insulation material is referred to as a second STI, simply to show it more clearly in the figures. Note, however, that the insulation material can be the same as the initially provided STI material (FIG. 2 and/or FIG. 6) or any other suitable insulator material. If the three different STI depositions (FIGS. 2, 6, and 9) are all done with the same insulator material, there will likely be no detectable delineation between the three corresponding STI sections. Alternatively, delineation between any of the three sections may be detectable if different materials and/or deposition process parameters are employed, for whatever reason. To this end, reference to $1^{st}$ and $2^{nd}$ STI in the figures is not intended to implicate any particular STI scheme; rather, the labeling scheme is simply provided for purposes of facilitating description. In any case, the planarization via CMP or other suitable means evens out the latest STI deposition with the top of the cladding layer fins.

As can be seen in FIG. 11, the process then continues with recessing the STI to expose the fin-pairs (cladding) above the STI height. Any suitable etch process (e.g., wet and/or dry etch) can be used to recess the STI material. In some cases, the etch chemistry is selective in that it only removes the STI material but none or relatively little of the fin (cladding) material. In other embodiments, a masking scheme can be used to protect the fins (cladding) while the STI is recessed. FIG. 12 shows a perspective view of another example resulting structure having fin-pairs formed from a cladding-on-core structure. As can be seen, each of the fin-pairs includes two fins separated by a distance $D_1$ that is substantially the same as the width of the underlying covered recess or fin as the case may be (FIG. 11 or FIG. 12, respectively). Note that "substantially the same" as used here may include distances in the range of $D_1$ to $D_2$, wherein $D_2$ is up to 20% greater than $D_1$, or 15% greater than $D_1$, or 10% greater than $D_1$, or 5% greater than $D_1$, or 2% greater than $D_1$, in accordance with some embodiments. The height above STI will become the active device fin height. Note the covered stub-like remnant of the sacrificial fin extending slightly from the substrate in FIG. 12, and the covered recess-like remnant of the sacrificial fin dipping into the substrate in FIG. 11. With reference to FIG. 11, note the covered recess may be, for example, concave, flat, or faceted. An alternative example location of the recess is shown with dashed lines; other locations will be apparent. Likewise, with reference to FIG. 12, note the top of the covered fin may be, for example, concave, flat, or faceted. Alternative examples of fin stub heights are shown with dashed lines (far left fin of FIG. 12); other locations will be apparent. Another example fin type may have a degree of tapering from the top to the bottom of the fin as shown with respect to the far right fin in FIG. 12. As will be appreciated, the shape of the covered recess or the top and sides of the covered fin can vary depending on factors such as the etch process used as well as the materials being etch. Other embodiments may not include such covered short fin or recess features. Still other embodiments may include other tell-tale signs of a sacrificial fin or core, as will be apparent in light of this disclosure, such as distinct STI depositions or other detectable features indicating where a sacrificial fin used to be in conjunction with a fin-pair above and offset to the sides of the sacrificial fin. Numerous such structural tell-tale features may be present to indicate the cladding-on-core approach was employed.

In any such cases, and according to an embodiment, there may be a repetitive variance in fin spacing. For instance, in one such example embodiment, the spacing between the two fins making up a fin-pair ($D_1$) is different than the spacing between that fin-pair and the next neighboring fin-pair ($D_3$). In another such example embodiment, the spacing $D_1$ between the two fins making up a first fin-pair is different than the spacing $D_1'$ between the two fins making up a second fin-pair neighboring the first fin-pair. In some such example embodiments, in addition to alternating or otherwise diverse fin-pair spacing (intra fin-pair spacing, $D_1$), the spacing between neighboring fin-pairs (inter fin-pair spacing, $D_2$) may also alternate or otherwise vary. Intra fin-pair spacing diversity may be provided, for example, by executing the cladding-on-core approach on a fin array having: a first sacrificial fin having a first width to provide a first intra-fin pair spacing, and a second sacrificial fin neighboring the first sacrificial fin having a second width to provide a second intra-fin pair spacing. Inter fin-pair spacing diversity may be provided, for example, by executing the cladding-on-core approach on a fin array having a first distance (spacing) between first and second sacrificial neighboring fins and a second distance (spacing) between the second sacrificial neighboring fin and a third neighboring sacrificial neighboring fin. Numerous embodiments having at least one of intra fin-pair spacing diversity and inter fin-pair spacing diversity will be appreciated in light of this disclosure.

Figure 13:
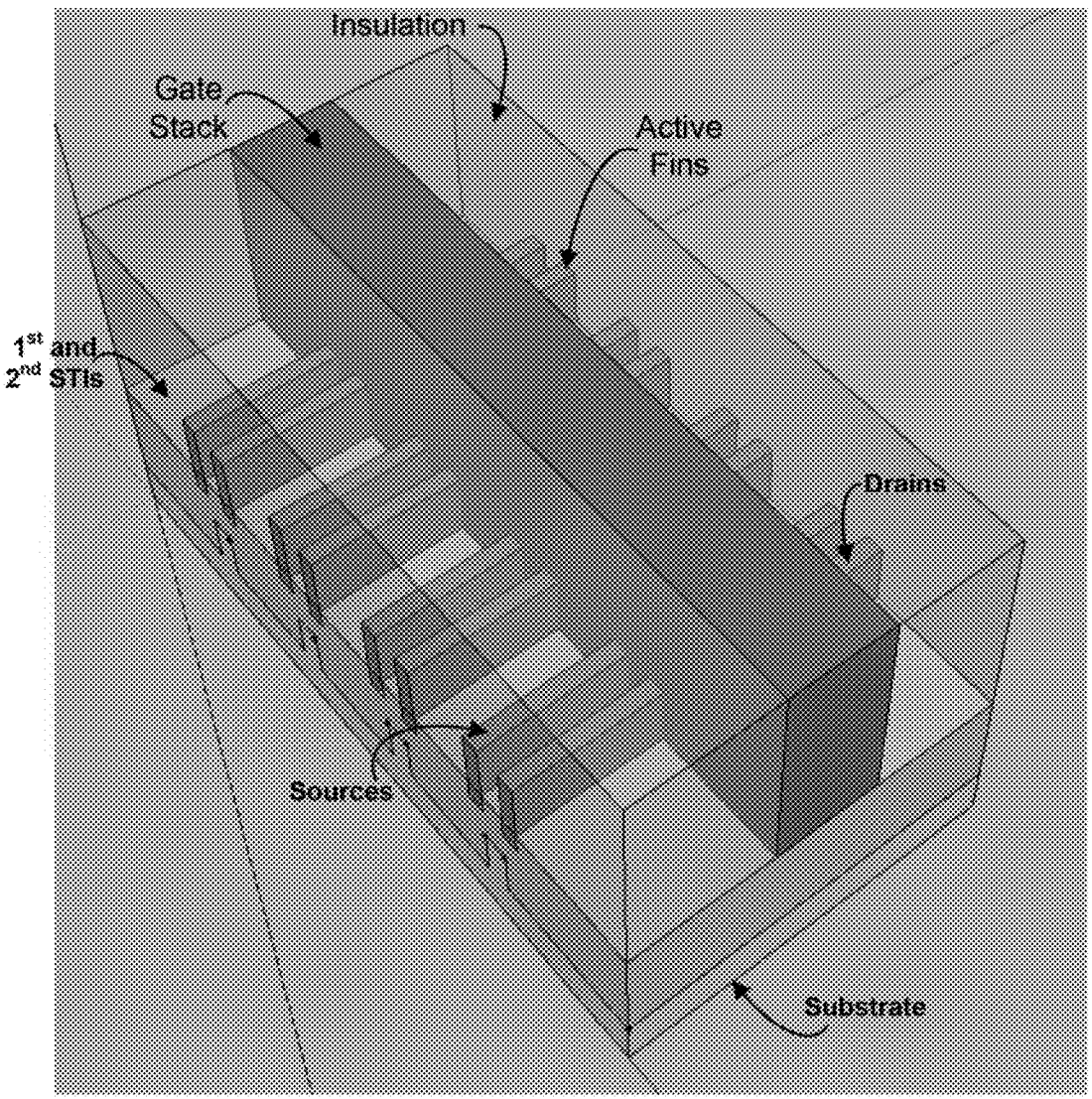
FIG. 13 shows a perspective view of the integrated circuit structure of FIG. 12 after formation of a gate structure, source and drains, and encapsulation with insulator material, in accordance with another embodiment of the present disclosure.

After exposing the cladding based fins, the process flow may continue in a standard manner, in some embodiments, or in a custom or proprietary manner in still other embodiments. Some flows may process the gate first followed by source/drain processing, while other flows may employ a gate-later process or so-called replacement metal gate (RMG) process where a dummy gate structure is initially provided and the actual gate is formed later in the process. For example, an RMG flow may include deposition of a passivation layer like silicon and/or a metal and/or a metal oxide along with a dummy gate oxide and dummy polysilicon gate electrode, followed by polysilicon patterning, source drain processing, insulator over everything, planarization, removal of dummy gate electrode polysilicon, and removal of dummy gate oxide, followed by depositing of gate oxide stack and metal gate fill, followed by planarization again. Contact patterning and processing can proceed using any standard processes. FIG. 13 shows an example structure having a gate stack formed over the cladding based fins. For purposes of example, assume the gate stack include a dummy gate oxide and gate electrode, and spacers, and that the dummy gate stack can later be replaced with desired gate materials (e.g., high-k gate oxide and metal gate electrode) using a standard RMG and contact forming process. The source/drains may be native to the cladding based fins in some embodiments, while in other embodiments are implemented with replacement source/drain materials as is sometimes done. The entire structure can then be encapsulated or covered with an insulator layer, planarized and any necessary contacts and interconnect layers can then be formed.

Thus, the techniques provided herein can be used to facilitate use of alternative materials for transistor channels, such as III-V, germanium, and SiGe channel devices. Simulations and measurements show the source-drain leakage to be eliminated or otherwise reduced relative to devices formed using standard processing. The techniques can be used to provide fin-based transistor device, such as those having FinFET, tri-gate, gate all around, nanoribbon, and nanowire configurations. The dimensions of the channel can be tailored to a given application. Shorter lengths of cladding, due to shorter exposed portions of sacrificial fins, can be used to make gate all around nanoribbon and nanowire configurations, as will be appreciated.

Example System

Figure 14:
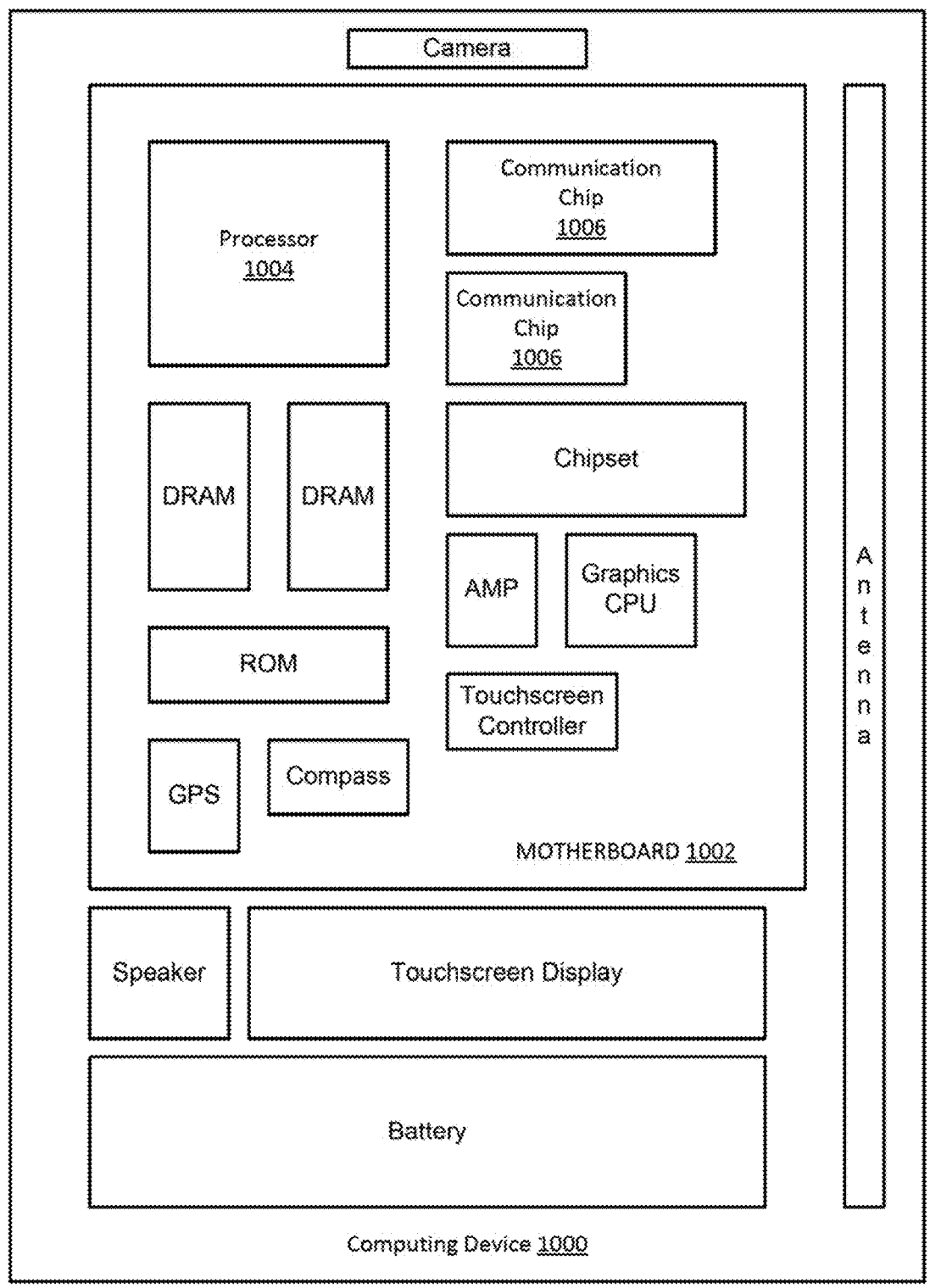
FIG. 14 illustrates a computing system implemented with one or more integrated circuit structures configured in accordance with an embodiment of the present disclosure.

FIG. 14 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with fin-on-insulator structure as provided herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The processor 1004 of the computing system 1000 includes an integrated circuit die packaged within the processor 1004. In some example embodiments of the present disclosure, the integrated circuit die of the processor 1004 includes one or more transistors configured with a fin-on-insulator structure as provided herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more fin-on-insulator transistor structures as provided herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs fin-based transistor devices as described herein (e.g., CMOS devices having both p and n type devices configured with customized channels on the same die, having reduced sub-channel leakage current and channel-to-substrate capacitance). As will be appreciated in light of this disclosure, various embodiments of the present disclosure can be used to improve performance on products fabricated at any process node (e.g., in the micron range, or sub-micron and beyond) by allowing for the use of fin-based transistors having high mobility customized and diverse channel configurations (e.g., Si, SiGe, Si/SiGe, III-V, and/or combinations thereof) on the same die.

Further Example Embodiments

The following examples pertain to further embodiments, from which numerous permutations and configurations will be apparent.

Example 1 is an integrated circuit device, comprising: a substrate having at least one of a plurality of covered fins extending from the substrate and a plurality of covered recesses extending into the substrate, each covered fin and/or recess covered by an insulation layer; and a fin-pair above each covered fin and/or recess, each fin-pair comprising a semiconductor material and extending from the insulation layer, wherein a thickness of the insulation layer separates each fin-pair from its underlying covered fin or recess.

Example 2 includes the subject matter of Example 1, wherein the covered fins comprise at least one of silicon fins, silicon germanium fins, germanium fins, and III-V material fins.

Example 3 includes the subject matter of Example 1, wherein the covered fins comprise replacement fins formed on the substrate from a material different than the substrate.

Example 4 includes the subject matter of Example 3, wherein the replacement fins comprise at least one of silicon fins, silicon germanium fins, germanium fins, and III-V material fins.

Example 5 includes the subject matter of any of the preceding Examples, wherein the covered fins comprise native fins formed from the substrate.

Example 6 includes the subject matter of any of the preceding Examples, wherein the substrate is a bulk substrate.

Example 7 includes the subject matter of any of the preceding Examples, wherein each of the fin-pairs includes two fins separated by a distance that is substantially the same as the width of the underlying covered fin or recess.

Example 8 includes the subject matter of any of the preceding Examples, wherein at least some of the covered fins are silicon fins and the semiconductor material of the fin-pairs above those silicon fins is silicon germanium.

Example 9 includes the subject matter of any of the preceding Examples, wherein at least some of the covered fins are silicon germanium fins and the semiconductor material of the fin-pairs above those silicon germanium fins is germanium.

Example 10 includes the subject matter of any of the preceding Examples, wherein at least some of the covered fins are gallium arsenide fins and the semiconductor material of the fin-pairs above those gallium arsenide fins is indium gallium arsenide.

Example 11 includes the subject matter of any of the preceding Examples, wherein at least some of the covered fins are indium phosphide fins and the semiconductor material of the fin-pairs above those indium phosphide fins is indium gallium arsenide.

Example 12 includes the subject matter of any of the preceding Examples, wherein at least some of the covered fins are gallium antimonide fins and the semiconductor material of the fin-pairs above those gallium antimonide fins is indium antimonide.

Example 13 includes the subject matter of any of the preceding Examples, wherein the substrate is a bulk silicon substrate, and the covered fins comprise native silicon fins, and the semiconductor material of the fin-pairs above those native silicon fins is silicon germanium.

Example 14 includes the subject matter of any of the preceding Examples, wherein the substrate is a bulk silicon substrate, and the covered fins comprise silicon germanium replacement fins, and the semiconductor material of the fin-pairs above those silicon germanium replacement fins is germanium.

Example 15 includes the subject matter of any of the preceding Examples, wherein the substrate is a bulk silicon substrate, and the covered fins comprise III-V material replacement fins, and the semiconductor material of the fin-pairs above those III-V material replacement fins is III-V material different from the replacement fin III-V material.

Example 16 is a system comprising the device of any of the preceding Examples.

Example 17 is an integrated circuit device, comprising: a substrate having a plurality of fins covered by a shallow trench isolation (STI) layer; a fin-pair above each covered fin, each fin-pair comprising a semiconductor material and extending from the STI layer, wherein a thickness of insulator material of the STI layer separates each fin-pair from its underlying covered fin; a transistor channel formed in each fin of the fin-pair; and a transistor source and a transistor drain formed in each fin of the fin-pair.

Example 18 includes the subject matter of Example 17, wherein the covered fins comprise at least one of silicon fins, silicon germanium fins, germanium fins, and III-V material fins.

Example 19 includes the subject matter of Example 17, wherein the covered fins comprise replacement fins formed on the substrate from a material different than the substrate.

Example 20 includes the subject matter of Example 19, wherein the replacement fins comprise at least one of silicon fins, silicon germanium fins, germanium fins, and III-V material fins.

Example 21 includes the subject matter of any of Examples 17 through 20, wherein the covered fins comprise native fins formed from the substrate.

Example 22 includes the subject matter of any of Examples 17 through 21, wherein the substrate is a bulk substrate.

Example 23 includes the subject matter of any of Examples 17 through 22, wherein each of the fin-pairs includes two fins separated by a distance that is substantially the same as the width of the underlying covered fin.

Example 24 includes the subject matter of any of Examples 17 through 23, wherein at least some of the covered fins are silicon fins and the semiconductor material of the fin-pairs above those silicon fins is silicon germanium.

Example 25 includes the subject matter of any of Examples 17 through 24, wherein at least some of the covered fins are silicon germanium fins and the semiconductor material of the fin-pairs above those silicon germanium fins is germanium.

Example 26 includes the subject matter of any of Examples 17 through 25, wherein at least some of the covered fins are gallium arsenide fins and the semiconductor material of the fin-pairs above those gallium arsenide fins is indium gallium arsenide.

Example 27 includes the subject matter of any of Examples 17 through 26, wherein at least some of the covered fins are indium phosphide fins and the semiconductor material of the fin-pairs above those indium phosphide fins is indium gallium arsenide.

Example 28 includes the subject matter of any of Examples 17 through 27, wherein at least some of the covered fins are gallium antimonide fins and the semiconductor material of the fin-pairs above those gallium antimonide fins is indium antimonide.

Example 29 includes the subject matter of any of Examples 17 through 28, wherein the substrate is a bulk silicon substrate, and the covered fins comprise native silicon fins, and the semiconductor material of the fin-pairs above those native silicon fins is silicon germanium.

Example 30 includes the subject matter of any of Examples 17 through 29, wherein the substrate is a bulk silicon substrate, and the covered fins comprise silicon germanium replacement fins, and the semiconductor material of the fin-pairs above those silicon germanium replacement fins is germanium.

Example 31 includes the subject matter of any of Examples 17 through 30, wherein the substrate is a bulk silicon substrate, and the covered fins comprise III-V material replacement fins, and the semiconductor material of the fin-pairs above those III-V material replacement fins is III-V material different from the replacement fin III-V material.

Example 32 is a method for forming a fin-based transistor structure, the method comprising: receiving a substrate having a plurality of sacrificial fins extending from the substrate and a shallow trench isolation (STI) on opposing sides of each sacrificial fin; recessing the STI to expose a top portion of the sacrificial fins; forming a cladding layer of semiconductor material on the exposed portion of the sacrificial fins; depositing insulation material to fill back in the recessed STI; removing the sacrificial fins by etching, thereby leaving new fins made of the cladding material, and such that the new fins are separated from the sacrificial fins; depositing further insulation material to fill back in the area left by removal of sacrificial fins; recessing the insulation material to expose a top portion of the new fins; and forming transistor devices using the new fins.

Example 33 includes the subject matter of Example 32, wherein the sacrificial fins comprise at least one of silicon fins, silicon germanium fins, germanium fins, and III-V material fins.

Example 34 includes the subject matter of Example 32 or 33, wherein the sacrificial fins comprise replacement fins formed on the substrate from a material different than the substrate.

Example 35 includes the subject matter of Example 34, wherein the replacement fins comprise at least one of silicon fins, silicon germanium fins, germanium fins, and III-V material fins.

Example 36 includes the subject matter of any of Examples 32 through 35, wherein the sacrificial fins comprise native fins formed from the substrate.

Example 37 includes the subject matter of any of Examples 32 through 36, wherein the substrate is a bulk substrate.

Example 38 includes the subject matter of any of Examples 32 through 37, wherein depositing insulation material to fill back in the recessed STI further includes planarizing so as to remove excess insulation material.

Example 39 includes the subject matter of Example 38, wherein the planarizing also removes cladding on top of the sacrificial fins.

Example 40 includes the subject matter of any of Examples 32 through 39, wherein depositing further insulation material to fill back in the area left by removal of sacrificial fins includes planarizing so as to remove excess insulation material down to top of the new fins.

Example 41 includes the subject matter of any of Examples 32 through 40, wherein forming transistor devices using the new fins includes at least one of a replacement metal gate (RMG) process and a replacement source/drain process.

Example 42 includes the subject matter of any of Examples 32 through 41, wherein receiving the substrate comprises: forming a plurality of sacrificial fins on the substrate, each sacrificial fin extending from the substrate; and forming a shallow trench isolation (STI) on opposing sides of each sacrificial fin.

Example 43 includes the subject matter of Example 42, wherein forming a plurality of sacrificial fins on the substrate comprises: recessing at least some native fins to provide a first set of trenches; and forming a sacrificial replacement fin of a first type in each trench of the first set of trenches.

Example 44 includes the subject matter of Example 43, wherein recessing at least some native fins to provide a first set of trenches comprises: masking a first set of native fins of the plurality so as to leave a first set of unmasked native fins; and recessing the first set of unmasked native fins to provide the first set of trenches.

Example 45 includes the subject matter of Example 44, and further includes masking each of the substitute fins of the first type so as to leave a second set of unmasked native fins;

recessing the second set of unmasked native fins to provide a second set of recesses; and forming a substitute fin of a second type in each recess of the second set of recesses.

Example 46 includes the subject matter of Example 45, wherein the substitute fins of the first type are configured for one of PMOS or NMOS and the substitute fins of the second type are configured for the other of PMOS or NMOS.

Example 47 includes the subject matter of any of Examples 32 through 46, wherein prior to each of depositing insulation material to fill back in the recessed STI and depositing further insulation material to fill back in the area left by removal of sacrificial fins, the method further comprises providing a passivation treatment on exposed portions of the cladding layer. Such a passivation layer can be used, for instance, to reduce or eliminate fixed and mobile charges at the semiconductor to STI interface, according to some embodiments.

Example 48 includes the subject matter of any of Examples 32 through 47, wherein the sacrificial fins comprise silicon fins and the cladding layer associated with the silicon fins is silicon germanium.

Example 49 includes the subject matter of any of Examples 32 through 48, wherein the sacrificial fins comprise silicon germanium fins and the cladding layer associated with the silicon germanium fins is germanium.

Example 50 includes the subject matter of any of Examples 32 through 49, wherein the sacrificial fins comprise gallium arsenide fins and the cladding layer associated with the gallium arsenide fins is indium gallium arsenide.

Example 51 includes the subject matter of any of Examples 32 through 50, wherein the sacrificial fins comprise indium phosphide fins and the cladding layer associated with the indium phosphide fins is indium gallium arsenide.

Example 52 includes the subject matter of any of Examples 32 through 51, wherein the sacrificial fins comprise gallium antimonide fins and the cladding layer associated with the gallium antimonide fins is indium antimonide.

Example 53 includes the subject matter of any of Examples 32 through 52, wherein the substrate is a bulk silicon substrate, and the sacrificial fins comprise native silicon fins, and the cladding associated with those native silicon fins is silicon germanium.

Example 54 includes the subject matter of any of Examples 32 through 53, wherein the substrate is a bulk silicon substrate, and the sacrificial fins comprise silicon germanium replacement fins, and the cladding associated with those silicon germanium replacement fins is germanium.

Example 55 includes the subject matter of any of Examples 32 through 54, wherein the substrate is a bulk silicon substrate, and the sacrificial fins comprise III-V material replacement fins, and the cladding associated with those III-V material replacement fins is III-V material different from the sacrificial fin III-V material.

Example 56 provides an integrated circuit formed by the method of any of Examples 32 through 55.

The foregoing description of example embodiments of the present disclosure has been presented for the purposes of illustration and description. It is not intended to be exhaustive or to limit the disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit device, comprising:
a substrate having one or both of (i) a plurality of covered fins extending from the substrate and/or (ii) a plurality of covered recesses extending into the substrate, wherein each covered fin and/or recess is covered by an insulation layer; and
a fin-pair above each covered fin and/or recess, each fin-pair comprising a semiconductor material, wherein the insulation layer is between the substrate and the fin-pair, such that a thickness of the insulation layer separates each fin-pair from its underlying covered fin or recess.

2. The device of claim 1 wherein the covered fins comprise a material different than the substrate, and wherein the covered fins comprise at least one of silicon fins, silicon germanium fins, germanium fins, and III-V material fins.

3. The device of claim 1 wherein the covered fins comprise native fins that are part of the substrate.

4. The device of claim 1 wherein each of the fin-pairs includes two fins separated by a distance that is substantially the same as the width of the underlying covered fin or recess.

5. The device of claim 1 wherein at least some of the covered fins are silicon fins and the semiconductor material of the fin-pairs above those silicon fins comprises silicon and germanium.

6. The device of claim 1 wherein at least some of the covered fins comprise silicon and germanium and the semiconductor material of the fin-pairs above those covered fins is germanium.

7. The device of claim 1 wherein at least some of the covered fins comprise gallium and arsenic and the semiconductor material of the fin-pairs above those covered fins comprises indium, gallium, and arsenic.

8. The device of claim 1 wherein at least some of the covered fins comprise indium and phosphorous and the semiconductor material of the fin-pairs above those covered fins comprises indium, gallium, and arsenic.

9. The device of claim 1 wherein at least some of the covered fins comprise gallium and antimony and the semiconductor material of the fin-pairs above those covered fins comprises indium and antimony.

10. The device of claim 1 wherein the substrate is a bulk silicon substrate, and the covered fins comprise native silicon fins, and the semiconductor material of the fin-pairs above those native silicon fins comprises silicon and germanium.

11. The device of claim 1 wherein the substrate is a bulk silicon substrate, and the covered fins comprise silicon and germanium fins, and the semiconductor material of the fin-pairs above those covered fins is germanium.

12. The device of claim 1 wherein the substrate is a bulk silicon substrate, and the covered fins comprise III-V material fins, and the semiconductor material of the fin-pairs above those covered fins is III-V material different from the covered fin III-V material.

13. An integrated circuit device, comprising:
a substrate having a plurality of fins covered by a shallow trench isolation (STI) region;
a fin-pair above each covered fin, each fin-pair comprising a semiconductor material, wherein a thickness of an insulator material of the STI region is between the substrate and the fin-pair and separates each fin-pair from its underlying covered fin;

a transistor gate structure on each fin of the fin-pair; and a transistor source and a transistor drain.

14. The device of claim 13 wherein the covered fins comprise replacement fins comprising a material different than the substrate.

15. The device of claim 14 wherein the replacement fins comprise at least one of silicon fins, silicon germanium fins, germanium fins, and III-V material fins.

16. The device of claim 13 wherein the covered fins comprise native fins that are part of the substrate.

17. The device of claim 13 wherein the substrate is a bulk substrate, and each of the fin-pairs includes two fins separated by a distance that is substantially the same as the width of the underlying covered fin.

18. An integrated circuit device, comprising:

a substrate having one or both of (i) a covered fin extending from the substrate and/or (ii) a covered recess extending into the substrate, wherein the covered fin and/or recess is covered by an insulation layer; and a fin-pair above the covered fin and/or fin-pair above the covered recess, each fin-pair comprising a semiconductor material, wherein the insulation layer is between the substrate and each fin-pair, such that a thickness of the insulation layer separates each fin-pair from its underlying covered fin or recess.

19. The device of claim 18 wherein the substrate is a bulk silicon substrate, and the covered fin is a silicon fin, and the semiconductor material of the fin-pair above the silicon fin comprises one or both of silicon and germanium.

20. The device of claim 18 wherein the substrate is a bulk silicon substrate, and the covered fin is a silicon fin, and the semiconductor material of the fin-pair above the silicon fin comprises one or more of gallium, indium, antimony, and arsenic.

* * * * *